United States Patent
Lee

(10) Patent No.: US 8,401,321 B2
(45) Date of Patent: Mar. 19, 2013

(54) METHOD AND APPARATUS FOR CONTEXT ADAPTIVE BINARY ARITHMETIC CODING AND DECODING

(75) Inventor: Bae-keun Lee, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1414 days.

(21) Appl. No.: 12/025,330

(22) Filed: Feb. 4, 2008

(65) Prior Publication Data

US 2008/0219578 A1  Sep. 11, 2008

(30) Foreign Application Priority Data

Mar. 7, 2007  (KR) .................. 10-2007-0022584

(51) Int. Cl.
*G06K 9/36* (2006.01)

(52) U.S. Cl. ........ 382/247; 382/232; 382/233; 382/236; 382/250; 382/251

(58) Field of Classification Search .......... 382/232, 382/233, 236, 250, 251; 375/240.01, 240.12, 375/240.16, 240.27, 240.26, 240.14

See application file for complete search history.

(56) References Cited

U.S. PATENT DOCUMENTS

| | | | |
|---|---|---|---|
| 5,119,424 A * | 6/1992 | Asakawa et al. | 704/208 |
| 6,249,613 B1 * | 6/2001 | Crinon et al. | 382/236 |
| 6,526,531 B1 * | 2/2003 | Wang | 714/704 |
| 7,176,815 B1 | 2/2007 | Hung et al. | |
| 2005/0123207 A1 * | 6/2005 | Marpe et al. | 382/239 |
| 2005/0169374 A1 | 8/2005 | Marpe et al. | |
| 2006/0017592 A1 * | 1/2006 | Shim et al. | 341/50 |
| 2006/0233260 A1 | 10/2006 | Watanabe | |
| 2010/0272188 A1 * | 10/2010 | Park et al. | 375/240.25 |

\* cited by examiner

*Primary Examiner* — Ali Bayat
(74) *Attorney, Agent, or Firm* — Sughrue Mion, PLLC

(57) ABSTRACT

A method of and apparatus for context adaptive binary arithmetic coding and decoding of a significance map indicating the position of a coefficient that is not zero in a residual block are provided. According to the method and apparatus, a subdivided context is selected according to whether or not a coefficient of a previous residual block corresponding to a coefficient of a current residual block, and binary arithmetic coding is performed according to the selected context, thereby improving the performance of context-based binary arithmetic coding.

9 Claims, 13 Drawing Sheets

FIG. 7

| | RESIDUAL BLOCK 1 (71) | | | | RESIDUAL BLOCK 2 (72) | | |
|---|---|---|---|---|---|---|---|
| S1, 1 | S1, 2 | S1, 6 | S1, 7 | S2, 1 | S2, 2 | S2, 6 | S2, 7 |
| S1, 3 | S1, 5 | S1, 8 | S1, 13 | S3, 3 | S2, 5 | S2, 8 | S2, 13 |
| S1, 4 | S1, 9 | S1, 12 | S1, 14 | S2, 4 | S2, 9 | S2, 12 | S2, 14 |
| S1, 10 | S1, 11 | S1, 15 | S1, 16 | S2, 10 | S2, 11 | S2, 15 | S2, 16 |
| S3, 1 | S3, 2 | S3, 6 | S3, 7 | S4, 1 | S4, 2 | S4, 6 | S4, 7 |
| S3, 3 | S3, 5 | S3, 8 | S3, 13 | S4, 3 | S4, 5 | S4, 8 | S4, 13 |
| S3, 4 | S3, 9 | S3, 12 | S3, 14 | S4, 4 | S4, 9 | S4, 12 | S4, 14 |
| S3, 10 | S3, 11 | S3, 15 | S3, 16 | S4, 10 | S4, 11 | S4, 15 | S4, 16 |

RESIDUAL BLOCK 3 (73)        RESIDUAL BLOCK 4 (74)

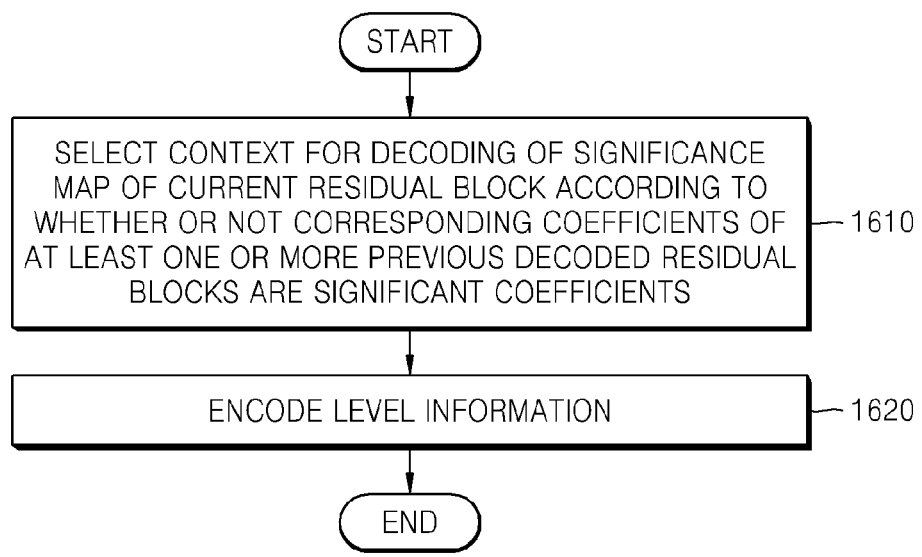
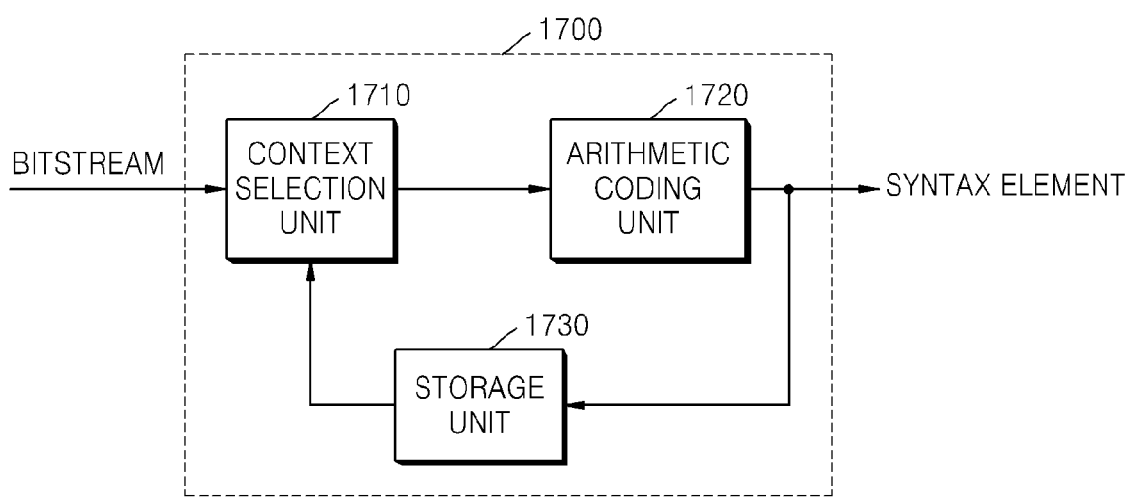

METHOD AND APPARATUS FOR CONTEXT ADAPTIVE BINARY ARITHMETIC CODING AND DECODING

CROSS-REFERENCE TO RELATED PATENT APPLICATIONS

This application claims the benefit of Korean Patent Application No. 10-2007-0022584, filed on Mar. 7, 2007, in the Korean Intellectual Property Office, the disclosure of which is incorporated herein in its entirety by reference.

BACKGROUND OF THE INVENTION

1. Field of the Invention

Apparatuses and methods consistent with the present invention relate to context adaptive binary arithmetic coding (CABAC), and more particularly, to a method of and apparatus for CABAC-encoding and CABAC-decoding a significance map indicating the positions of significant coefficients having non-zero value of a residual block.

2. Description of the Related Art

Since the amount of moving picture data is very large, moving picture data is usually compressed before it is stored or transmitted. There are a variety of methods of compressing data, and the compression of data should satisfy a predetermined standard. These standards include MPEG-4 Part 10 Advanced Video Coding (AVC) or ITU-T H.264. H.264 has been formulated in order to cope with rapid penetration of communication channels such as mobile communication networks, and is designed to enable a variety of communication infrastructures to switch from traditional circuit switching methods to packet switching services. Compared to MPEG-4 Part 2 Visual Codec, which is a previous standard, H.264 has improved encoding efficiency by 50% or more. H.264 is a video data compression standard which considers rapidly changing wireless environments and Internet environments, thereby reducing errors. H.264 also considers network adaptive methods.

H.264 uses context adaptive binary arithmetic coding (CABAC) which is an arithmetic coding technique with enhanced compression efficiency. The CABAC is an entropy encoding method of compressing data by using probabilities of symbols.

FIG. 1 is a block diagram illustrating an apparatus for CABAC according to conventional technology. In an encoding process according to H.264, a discrete cosine transform is performed in units of residual blocks, each of which has a size of 4×4, and then, a syntax element is generated in relation to each 4×4 residual block.

Referring to FIG. 1, the CABAC encoding apparatus according to the conventional technology broadly includes a binarizer 10, a context modeler 20, and a binary arithmetic coder 30. Also, the arithmetic coder 30 includes a regular coding engine 32 and a bypass coding engine 34.

If a non-binary valued syntax element is input, the binarizer 10 maps the syntax element into a sequence of binary values, thereby outputting a bin string.

In order to increase the processing speed of the encoding process, the bin string obtained by mapping into binary values by the binarizer 10 or predetermined bin values selected from a syntax element having binary values therein is encoded by the bypass coder 34 without being input to the context modeler 20, and is output as a bitstream. Other bins are input to the context modeler 20. Here, a bin indicates each bit of a bin string.

Based on the input bin values or a previously encoded syntax element, the context modeler 20 determines a probability model required for encoding a currently input bin.

The regular coding engine 32 arithmetic-encodes the input bin value, based on the probability model determined in the context modeler 20, and generates a bitstream.

According to the H.264 standard draft, a block which is currently encoded is classified into one of roughly five types as illustrated in table 1 below, and in order to encode a syntax element in relation to a block belonging to each type, a different context is applied:

TABLE 1

| Block types | # of coeff. | Context Type |
|---|---|---|
| Luminance DC block for INTRA16 × 16 mode | 16 | 0: Luma-Intra16-DC |
| Luminance AC block for INTRA16 × 16 mode | 15 | 1: Luma-Intra16-AC |
| Luminance block for INTRA 4 × 4 mode | 16 | 2: Luma-4 × 4 |
| Luminance block for INTER mode | 16 | |
| U-Chrominance DC block for INTRA mode | 4 | 3: Chroma-DC |
| V-Chrominance DC block for INTRA mode | 4 | |
| U-Chrominance DC block for INTER mode | 4 | |
| V-Chrominance DC block for INTER mode | 4 | |
| U-Chrominance AC block for INTRA mode | 15 | 4: Chroma-AC |
| V-Chrominance AC block for INTRA mode | 15 | |
| U-Chrominance AC block for INTER mode | 15 | |
| V-Chrominance AC block for INTER mode | 15 | |

In the encoding process according to H.264, DCT and quantization is performed in units of 4×4 residual blocks, and then, a syntax element of residual data is generated in relation to each 4×4 residual block. Syntax elements of the 4×4 residual block defined in H.264 includes coded_block_flag, significant_coeff_flag[i], and coeff_sign_flag[i].

FIG. 2 is a flowchart illustrating a process of encoding residual data according to conventional technology.

Referring to FIG. 2, in operation 210, coded_block_flag, which indicates whether or not a non-zero coefficient value exists among 16 quantized coefficients of a current 4×4 residual block, is encoded. In a given residual block, if the coded_block_flag is 0, it means that no information to be transmitted exists. According to the H.264 standard draft, a context which is used in the encoding of the coded_block_flag of the current residual block is determined by using context information which is used for encoding adjacent blocks of the same type as that of the current residual block, positioned above and to the left of the current residual block.

In operation 220, if a non-zero coefficient value (hereinafter referred to as a significant coefficient) exists in the current 4×4 residual block, a significance map indicating the position of the significant coefficient is encoded. The significance map is formed with significant bits and an end-of-block (EOB). A significant bit indicates whether a coefficient according to each scan index is a significant coefficient or 0, and is expressed by significant_coeff_flag[i]. Here, significant_coeff_flag[i] indicates whether or not the coefficient value of an i-th scan index among 16 coefficients of a 4×4 residual block is 0.

FIGS. 3A and 3B are diagrams illustrating a significance map of a 4×4 residual block according to conventional technology.

Referring to FIG. 3A, it is assumed that coefficients at the positions marked by X among coefficients in the 4×4 residual block 31 have predetermined non-zero values. In this case, as illustrated in FIG. 3B, a significance map 32 is obtained by expressing each significant coefficient among the coefficients in the 4×4 residual block as 1, and each insignificant coefficient having zero value as 0. The significance map is scanned in a predetermined scan order, and thus context-based arithmetic encoding is performed. For example, in the case of raster scanning in which contents are scanned from the left-hand side to the right-hand side, and from the top to the bottom, when the significance map as illustrated in FIG. 3A is encoded, a bin string of ☐ 1 1 1 1 1 1 1 1 0101000☐s is context-based encoded. In order to encode a significance map, 15 different probability models are used for significant_coeff_flag and last_significant_coeff_flag. A context used for encoding a significance map is determined according to a scanning position of a predetermined scan order. That is, according to the conventional technology, when the significance map as illustrated in FIG. 3B is encoded, a context to be used for encoding is determined according to the position of each coefficient.

Referring again to FIG. 2, in operation 230, level information of a significant coefficient, i.e., the sign and absolute value (abs) of the significant coefficient is encoded. In respect of image encoding efficient, it is known that the performance of the CABAC is generally better than the performance of context adaptive variable length coding (CAVLC). The overhead of the CAVLC is about 10~15% more than that of the CABAC.

FIG. 4 is a graph illustrating the performance difference between the CABAC and the CAVLC with respect to a variety of quantization parameter values according to conventional technology. FIG. 4 illustrates the incremental amount of overhead when the symbols and texture of an image sequence (football CIF) are encoded by using the CAVLC, with reference to the amount of overhead occurring when the same symbols and texture of the image are encoded by using the CABAC. The symbol (♦) indicates the amount of overhead which increases when the symbols of the image sequence (football CIF) are encoded by using the CAVLC, compared to the CABAC, and the symbol (■) indicates the amount of overhead which increases when the texture of the image sequence (football CIF) is encoded by using the CAVLC, compared to the CABAC.

Referring to FIG. 4, when texture is encoded, the amount of overhead occurring when the CAVLC is used greatly increases compared to that of the CABAC, with the increasing quantization parameter (QP) value. However, when the QP value is low, there is no big difference between the overhead occurring when the CABAC is used, and the overhead occurring when the CAVLC is used. Referring to FIG. 4, for example, when the QP value is 24, the incremental amount of overhead when texture is encoded by using the CAVLC is mere 3%. In other words, when the value of a QP value is small, i.e., when the picture quality of an image is good, the encoding performance of the CABAC is relatively decreased.

One of the reasons why the encoding performance of the CABAC is decreased in a low QP is inefficiency of context modeling of a significance map indicating the positions of significant coefficients.

FIG. 5 is a graph illustrating probabilities of significant coefficients in each scan index occurring when a significance map of a 4×4 residual block is encoded according to conventional technology. FIG. 6 is a graph illustrating probabilities of insignificant coefficients in each scan index occurring when a significance map of a 4×4 residual block, with respect to changes in quantization parameter values according to conventional technology. FIG. 5 illustrates the probability of a significant coefficient of each scan index when QP=24 and a significance map of a 4×4 residual block of a Football QCIF image is scanned according to a raster scan order. FIG. 6 illustrates the probability that an insignificant coefficient, i.e., a coefficient which is 0, occurs in each scan index when a significance map of a 4×4 residual block of a BUS CIF image in relation to each of when QP=24, when QP=30, and when QP=34. Here, a scan index is an index indicating the position of each coefficient of a 4×4 residual block according to the scanning order. For example, scan index 1 indicates the position of a coefficient of a direct current (DC) component positioned at the first column of the first line of a 4×4 residual block.

Referring to FIG. 5, in some scan indexes such as the second and fifth scan indexes, the probability of a significant coefficient and the probability of an insignificant coefficient are both about 50%, and similar to each other. Referring to FIG. 6, with the decreasing QP value, coefficients around a DC component, in particular, for example, in the first, fifth and ninth scan indexes, the probability difference between a significant coefficient and an insignificant coefficient becomes relatively small.

Thus, according to the conventional technology, in some scan indexes, probabilities of insignificant coefficients and significant coefficients are set to similar values. That is, when a significance map is encoded, a context is set according to a scan index, and in a probability model according to the selected context, the probabilities of a most probable symbol (MPS) and a least probable symbol (LPS) in a certain scan index can be set to values similar to each other. The performance of the CABAC is lowered when the probabilities of an MPS and an LPS are similar to each other. This is well known. Accordingly, in order to make the difference between probabilities of an MPS and an LPS greater when a context for encoding a significance map is selected, a method of more efficiently performing context modeling is needed.

SUMMARY OF THE INVENTION

The present invention provides a method of and apparatus for context-based binary arithmetic coding and decoding, in which when a significance map indicating the positions of significant coefficients of a residual block is encoded, context modeling using a correlation with a previous residual block is further divided and the difference between an MPS and an LPS is made to be larger such that the performance of binary arithmetic coding can be improved.

According to an aspect of the present invention, there is provided a method of context-based adaptive binary arithmetic coding including: determining a significant coefficient that is not 0 from among coefficients in a current residual block of a predetermined size; selecting a context to be used for encoding predetermined flags indicating the positions of significant coefficients in the current residual block, according to whether or not a coefficient of at least one previous residual block, corresponding to a coefficient of the current residual block is a significant coefficient; and performing context-based adaptive binary arithmetic coding of the flags according to the selected context.

According to another aspect of the present invention, there is provided an apparatus for context-based adaptive binary arithmetic coding including: a storage unit storing information on a syntax element of residual blocks processed before a current residual block of a predetermined size, and information on predetermined flags indicating the positions of significant coefficients; a context selection unit selecting a context to be used for encoding flags indicating the positions of significant coefficients in the current residual block, according to whether or not a coefficient of at least one previous residual block, corresponding to a coefficient of the current residual block is a significant coefficient, by using the flag information read from the storage unit; and an arithmetic coding unit performing context-based adaptive binary arithmetic coding of the flags of the current residual bloc, by using the selected context.

According to another aspect of the present invention, there is provided a method of context-based adaptive binary arithmetic decoding including: selecting a context to be used for decoding predetermined flags indicating the positions of significant coefficients in a current residual block to be decoded, according to whether or not a coefficient of at least one previously decoded residual block, corresponding to a coefficient of the current residual block is a significant coefficient that is not 0; and performing binary arithmetic decoding of flags indicating the significant coefficient of the current residual block, by using the probability information according to the selected context.

According to another aspect of the present invention, there is provided an apparatus for context-based adaptive binary arithmetic decoding including: a context selection unit selecting a context to be used for decoding predetermined flags indicating the positions of significant coefficients in a current residual block to be decoded, according to whether or not a coefficient of at least one previously decoded residual block, corresponding to a coefficient of the current residual block is a significant coefficient that is not 0; and a binary arithmetic decoding unit performing binary arithmetic decoding of flags indicating the significant coefficient of the current residual block, by using the probability information according to the selected context.

BRIEF DESCRIPTION OF THE DRAWINGS

The above and other features and advantages of the present invention will become more apparent by describing in detail exemplary embodiments thereof with reference to the attached drawings in which:

FIG. 7 is a diagram illustrating an example of 4×4 residual blocks which are encoded according to an embodiment of the present invention;

FIG. 16 is a flowchart illustrating a method of context-based binary arithmetic decoding according to an embodiment of the present invention; and FIG. 17 is a diagram illustrating a structure of a context-based binary arithmetic decoding apparatus according to an embodiment of the present invention.

DETAILED DESCRIPTION OF THE INVENTION

The present invention will now be described more fully with reference to the accompanying drawings, in which exemplary embodiments of the invention are shown.

First, a process of selecting a context for encoding a significant map by considering a spatial correlation according to the present invention will now be explained.

Figure 1:
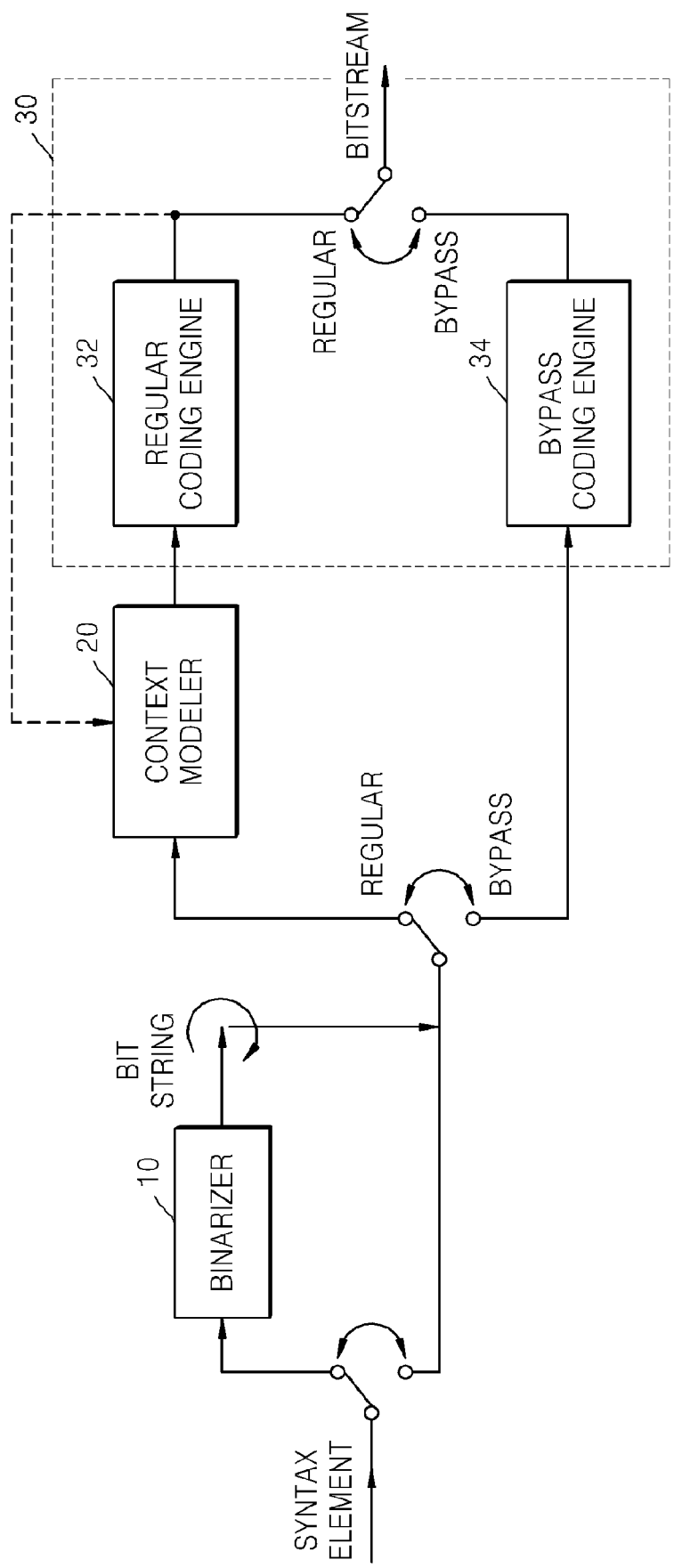
FIG. 1 is a block diagram illustrating an apparatus for context adaptive binary arithmetic coding (CABAC) according to conventional technology.
Figures 2, 3A, 3B:
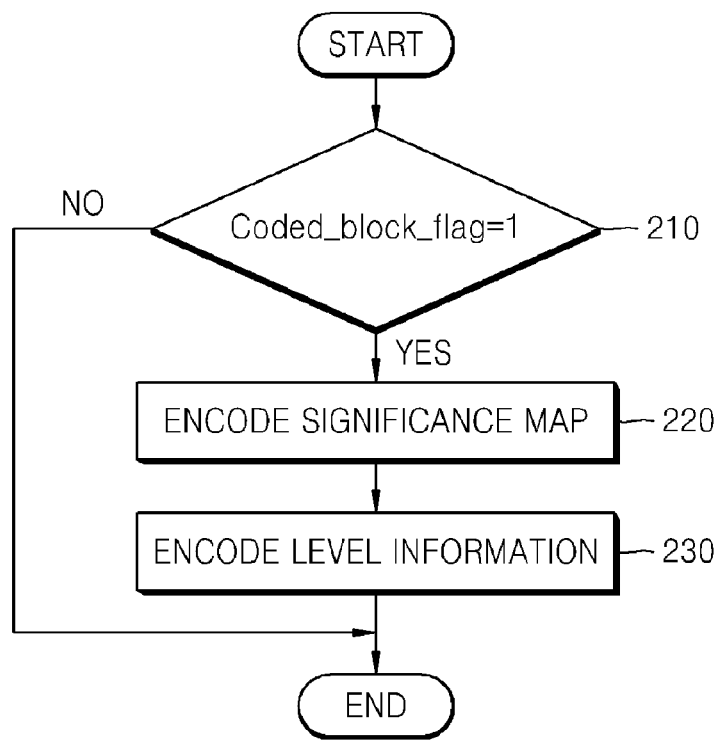
FIG. 2 is a flowchart illustrating a process of encoding residual data according to conventional technology.
FIGS. 3A and 3B are diagrams illustrating a significance map of a 4×4 residual block according to conventional technology.
Figure 4:
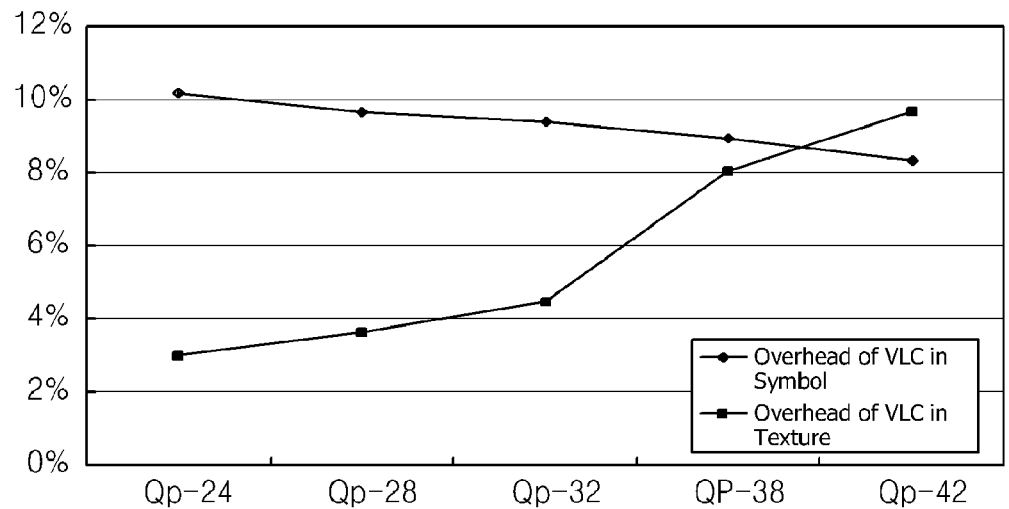
FIG. 4 is a graph illustrating the performance difference between CABAC and context adaptive variable length coding (CAVLC) with respect to a variety of quantization parameter values according to conventional technology.
Figure 5:
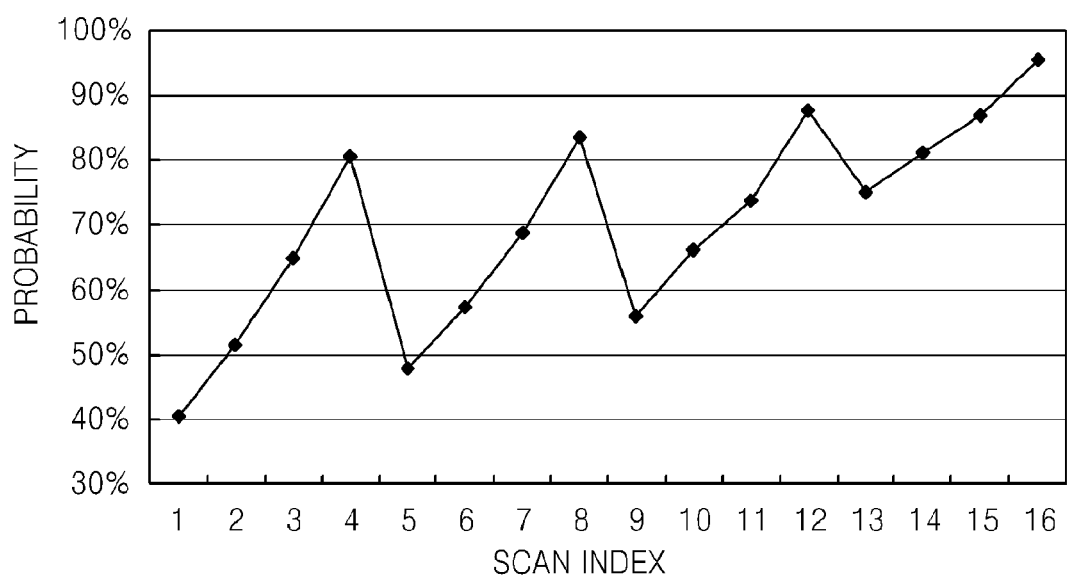
FIG. 5 is a graph illustrating probabilities of significant coefficients in each scan index occurring when a significance map of a 4×4 residual block is encoded according to conventional technology.
Figure 6:
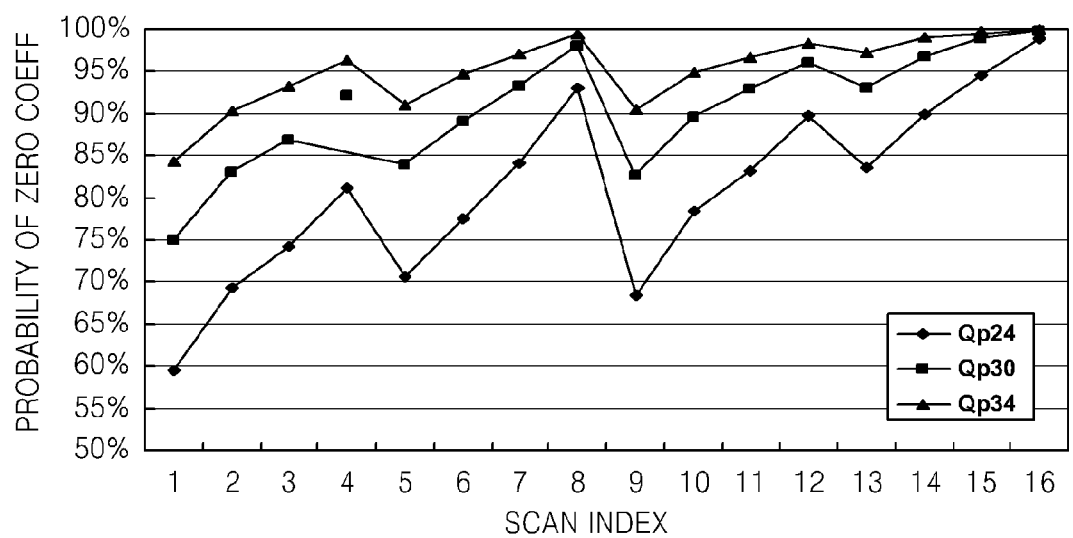
FIG. 6 is a graph illustrating probabilities of insignificant coefficients in each scan index occurring when a significance map of a 4×4 residual block, with respect to changes in quantization parameter values according to conventional technology.
Figure 8:
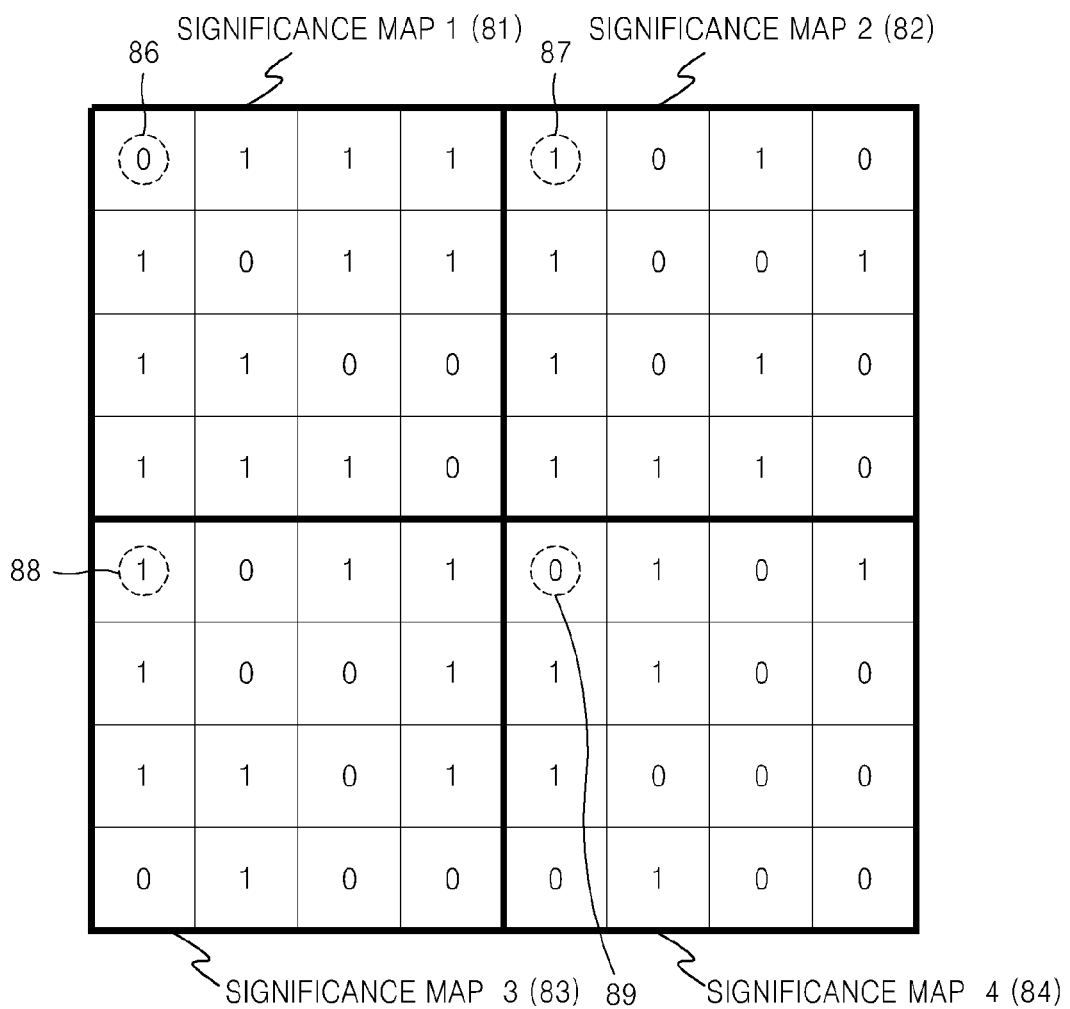
FIG. 8 is a diagram illustrating an example of a significance map of 4×4 residual blocks illustrated in FIG. 7 according to an embodiment of the present invention.

FIG. 7 is a diagram illustrating an example of 4×4 residual blocks which are encoded according to an embodiment of the present invention, and FIG. 8 is a diagram illustrating an example of a significance map of 4×4 residual blocks illustrated in FIG. 7 according to an embodiment of the present invention. In FIG. 7, (Sa,b) indicates a coefficient value of the b-th scan index of a residual block a. Hereinafter, it is assumed that a residual block is a block which is obtained by transforming an error value between a prediction block generated by intra prediction or inter predication and an original image block, into the frequency domain, and then, quantizing the value. Also, a scan index is an index indicating the position of each coefficient in a residual block, and indicates the positions of coefficients in a residual block or binary values of a significant map according to a predetermined scan order. For example, when it is assumed that a 4×4 residual block is scanned in a zigzag scan order, each coefficient in the 4×4 residual block can be defined as a value existing at a position expressed by any one of scan indexes 1 through 16 according to the scan order.

A predetermined correlation exists between coefficients of a previous residual block and corresponding coefficients of a current residual block. More specifically, if the coefficient at an i-th scan index of the previous residual block is a significant coefficient that is not 0, it is highly probable that a coefficient at an i-th scan index of the current residual block corresponding to the coefficient is also a significant coefficient that is not 0. For example, in FIG. 7, if (S3,1), which is a DC coefficient of residual block 3, is a nonzero significant coefficient, it is highly probable that (S4,1) which is a DC coefficient of residual block 4, the next block, is also a non-zero significant coefficient. Similarly, if (S3,1) which is the DC coefficient of residual block 3 is 0, it is highly probable that (S4,1) which is the DC coefficient of the next residual block 4, is also 0. Correlations between coefficients of residual blocks which are spatially adjacent to each other are large especially between a DC component coefficient (Sa,1) (a=1,2,3,4) and neighboring coefficients having relatively low frequency components, for example, coefficient of (Sa, 2), (Sa,3), (Sa,4), (Sa,5), and (Sa,6) (a=1,2,3,4). According to the present invention, by considering these spatial correlations between residual blocks, a context which is usually used when a predetermined flag, i.e., significant_coeff_flag[i], indicating whether or not a coefficient of an i-th scan index (i=1,2,3, . . . , 15, 16) of a current residual block is a significant coefficient, is encoded, is further divided and selected according to whether or not a corresponding coefficient of a previous residual block is a significant coefficient, and by using a probability model based on the selected context, the significant_coeff_flag[i] is encoded.

For example, as illustrated in FIG. 8, assuming that there are significance maps 81, 82, 83, and 84, generated by expressing significant coefficients that are not 0 in a residual block, as 1, and expressing insignificant coefficients as 0, encoding of the significance maps 81 through 84 will now be explained. Being scanned in the zigzag scan order as illustrated in the residual block 1 of FIG. 7, the significance maps 81 through 84 of the residual blocks are context-based binary arithmetic coded. According to the present invention, when binary values of a significance map of a current residual block, i.e., significant_coeff_flag[i], are encoded, a context to be used for encoding binary values 0 and 1 of the significance map being currently encoded is determined according to whether corresponding binary values in significance maps of at least one or more previous residual blocks are 0 or 1. For example, when 0, which is the binary value of the first scan index 89 of significance map 4, is encoded, a different context is selected according to whether the corresponding binary value of the first scan index 88 of the significance map 3 of a previous residual block. Here, a context is formed with the probability values of an MPS and an LPS, and a binary value identical to the binary value of the corresponding scan index in the previous significance map becomes the MPS. That is, if the binary value of a corresponding scan index in the previous significance map is 0, 0 becomes the MPS and if the binary value of the corresponding scan index is 1, 1 becomes the MPS.

Similarly, a context to be used for encoding each of the binary values of the remaining scan indexes in the significance map 84 is selected according to the binary value of the corresponding index in the significance map 3 of the previous residual block. If the binary value of the significance map of the previous residual block corresponding to an i-th scan index of the significance map of the current residual block is defined as j (j=0,1), and a context to be used for encoding the binary value of the i-th scan index of the current significance map is defined as (CTX i,j), then, when the binary value of the corresponding scan index in the previous significance map is 0, (CTX i,0) is selected in order to encode the binary value of the i-th scan index of the current significance map, and when the binary value of the corresponding scan index in the previous significance map is 1, (CTX i,1) is selected.

For example, in FIG. 8, when the binary value of the first index 89 of the significance map 4 is encoded, the binary value of the corresponding first scan index 88 of the significance map 3 of the previous residual block is 1, and therefore context (CTX 1,1) is selected. If the binary value of the corresponding first scan index 88 of the significance map 3 of the previous residual block is 0, context (CTX 1,0) is selected when the binary value of the first scan index 89 of the significance map 4. Similarly, when the binary value of an i-th scan index of the significance map 4 is encoded, any one context of (CTX i,0) and (CTX i,1) is selected according to the binary value of the corresponding i-th scan index of the significance map 3 of the previous residual block. In the context (CTX i,0) which is selected when the binary value of the corresponding scan index in the previous significance map is 0, binary value 0 has a greater probability value in the scan index of the current significance map. In the context (CTX i,1) which is selected when the binary value of the corresponding scan index in the previous significance map is 1, binary value 1 has a greater probability value in the scan index of the current significance map.

Figure 9:
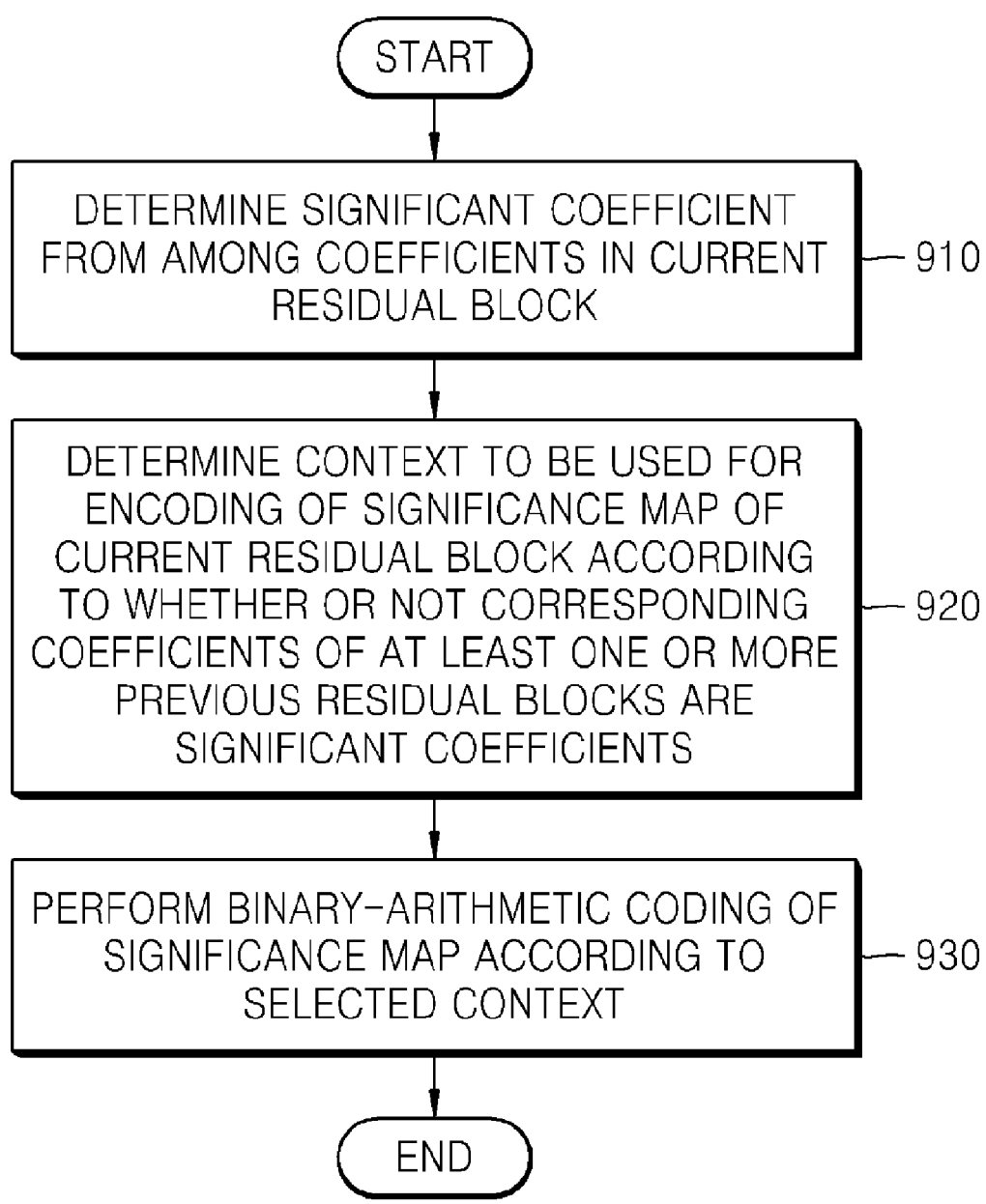
FIG. 9 is a flowchart illustrating a method of context based encoding of an image according to an embodiment of the present invention.

FIG. 9 is a flowchart illustrating a method of context based encoding of an image according to an embodiment of the present invention.

Referring to FIG. 9, in operation 910, a significant coefficient that is not 0 is determined from among coefficients in a current residual block, and the significant coefficient is set to 1, thereby generating a significance map indicating the positions of coefficients in the current residual block. In other words, the significant coefficient that is not 0 from among coefficients in the current residual block, is set to 1 to generate the significance map. The significance map is expressed by significant_coeff_flag[i] in which a coefficient of scan index i which is not 0 has a value 1, and a coefficient of scan index i which is 0 has a value 0.

In operation 920, according to whether or not a corresponding coefficient of at least one or more previous residual blocks that are encoded before a current residual block is a significant coefficient, a context which is used for encoding of the significance map of the current residual block is determined. In order to determine the significance maps of the previous residual blocks that are considered when a context for encoding the significance map of the current residual block, the significance map of one residual block that is encoded before the current residual block, or the significance maps of at least two residual blocks that are encoded previously, or the significance maps of two residual blocks positioned above and to the left of the current residual block, respectively, may be used. However, the present invention is not limited to these, and the number and type of significance maps of the previous residual blocks that are considered in order to determine the context for encoding the significance map of the current residual block can vary in a variety of ways.

In operation 930, by using the probability values of an MPS and an LPS according to the selected context, binary values forming the significance map of the current residual block, i.e., significant_coeff_flag[i], are binary-arithmetic-encoded. For example, when the binary values of the significance map 4 illustrated in FIG. 8 are scanned in a zigzag scan order and encoded, each bit of the bin string □0111101000100000□ forming the significance map 4 is binary-arithmetic-encoded by using a context selected according to the binary value of the corresponding index of a previous residual block.

Figure 10:
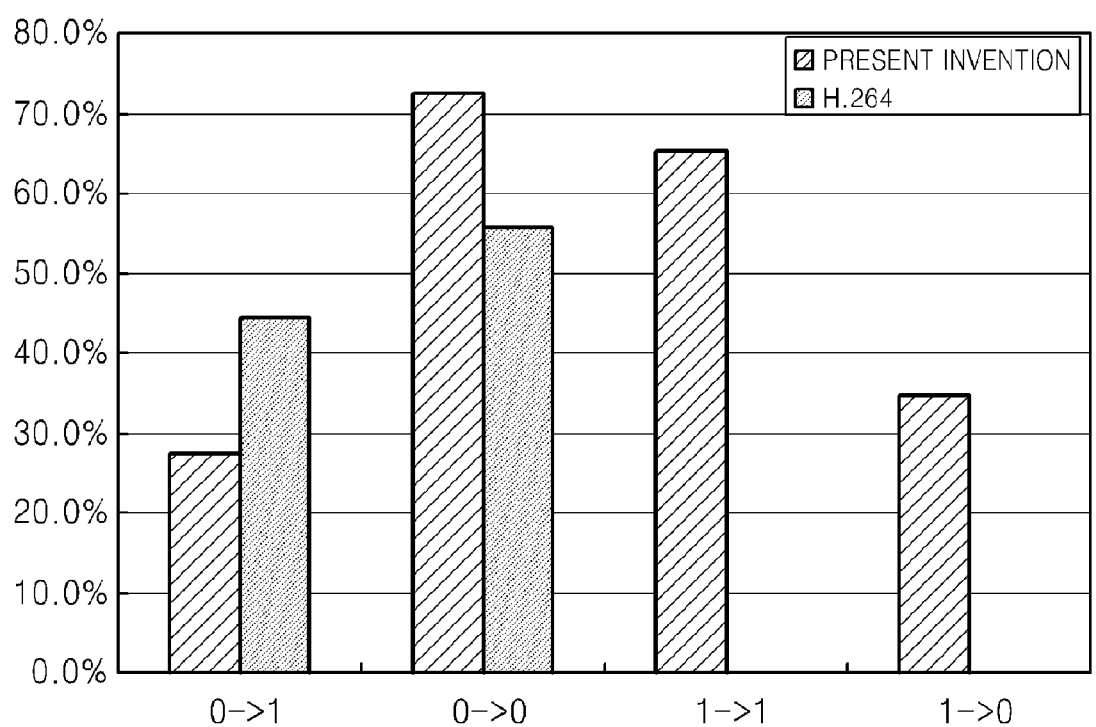
FIG. 10 is a graph comparing a probability model of a context, which is selected by using information on a previous residual block according to an embodiment of the present invention, and a probability model of a context according to a conventional H.264 standard draft.

FIG. 10 is a graph comparing a probability model of a context, which is selected by using information on a previous residual block according to an embodiment of the present invention, and a probability model of a context according to a conventional H.264 standard draft. In FIG. 10, a probability model of a context which is used when the first scan index of the significance map of a 4×4 residual block, i.e., significant-- coeff_flag[1], is encoded is illustrated. Also, in the graph illustrated in FIG. 10, ▭a->b▭ (a,b=0,1) of the X-axis indicates a case where significant_coeff_flag[1]=a in the significance map of a previous residual block, and significant_coeff_flag[1]=b in the significance map of a current residual block. That is, ▭0->1▭ indicates a case where a coefficient of the previous residual block which is 0 changes to a coefficient of the current residual block which is a significant coefficient. ▭1->0▭ indicates a case where a significant coefficient in the previous residual block changes to a coefficient of the current residual block which is 0. ▭ -> 1▭ indicates a case where coefficients in both the previous residual block and the current residual block are significant coefficients. ▭ -> 0▭ indicates a case where coefficients in both the previous residual block and the current residual block are 0. Also, the Y-axis of the graph illustrated in FIG. 10 indicates the probability value of a binary value (b) of the significance map of the current residual block provided according to a context selected according to the value of the corresponding coefficient in the previous residual block.

Referring to FIG. 10, in the conventional H.264 standard draft, a context is determined according to a scan index of a current residual block irrespective of whether a corresponding coefficient of a previous residual block is 0 or 1. In the H.264 standard draft, in the first scan index position, a context in which the probability of 1 is set to 45% and the probability of 0 is set to 55% is used.

However, according to the present invention, in order to encode the significance map of the current residual block, a case where a corresponding coefficient of the previous residual block is a significant coefficient and a case where the corresponding coefficient is an insignificant coefficient are divided, and a different context, i.e., a different probability model, is applied.

More specifically, if the corresponding coefficient of the previous residual block is an insignificant coefficient (when a is 0 in ▭a->b▭), a spatial correlation is considered, thereby selecting a context model in which the probability that the corresponding coefficient of the current residual block is also an insignificant coefficient is greater. As illustrated in FIG. 10, in a context selected when the coefficient of the previous residual block is 0 according to the present invention, the probability that the coefficient of the current residual block is a significant coefficient (▭0->1▭) is about 0.28 (28%), and the probability that the coefficient of the current residual block is (▭0->0▭) is about 0.72 (72%). Thus, according to the present invention, when the coefficient of the previous residual block is an insignificant coefficient that is 0, a context in which 0 is the MPS and has a relatively greater probability than that of 1 is selected.

Similarly, according to the present invention, when a corresponding coefficient of the previous residual block is a significant coefficient (when a is 1 in ▭a->b▭), a context model in which the probability that the corresponding coefficient of the current residual block is also a significant coefficient is greater is selected. In FIG. 10, according to a context which is selected when the coefficient of the previous residual block is a significant coefficient according to the present invention, the probability that the coefficient of the current residual block is a significant coefficient (▭1->1▭) is about 0.65 (65%), and the probability that the coefficient of the current residual block is 0 (▭1->0▭) is about 0.35 (35%). Thus, according to the present invention, when the coefficient of the previous residual block is a significant coefficient, a context in which 1 is the MPS and has a relatively greater probability than that of 0 is selected.

Also, according to the present invention as illustrated in FIG. 10, the difference between the probability values of an MPS and an LPS which are provided by a context selected according to whether the coefficient of the previous residual block is a significant coefficient, is set as a bigger value, thereby improving the performance of the CABAC. Since the performance of the CABAC improves with the increasing difference between the probability values of the MPS and the LPS, a more subdivided context model is applied according to whether or not the coefficient of the previous residual block is a significant coefficient, in the present invention, thereby improving the performance of the CABAC.

Figure 11:
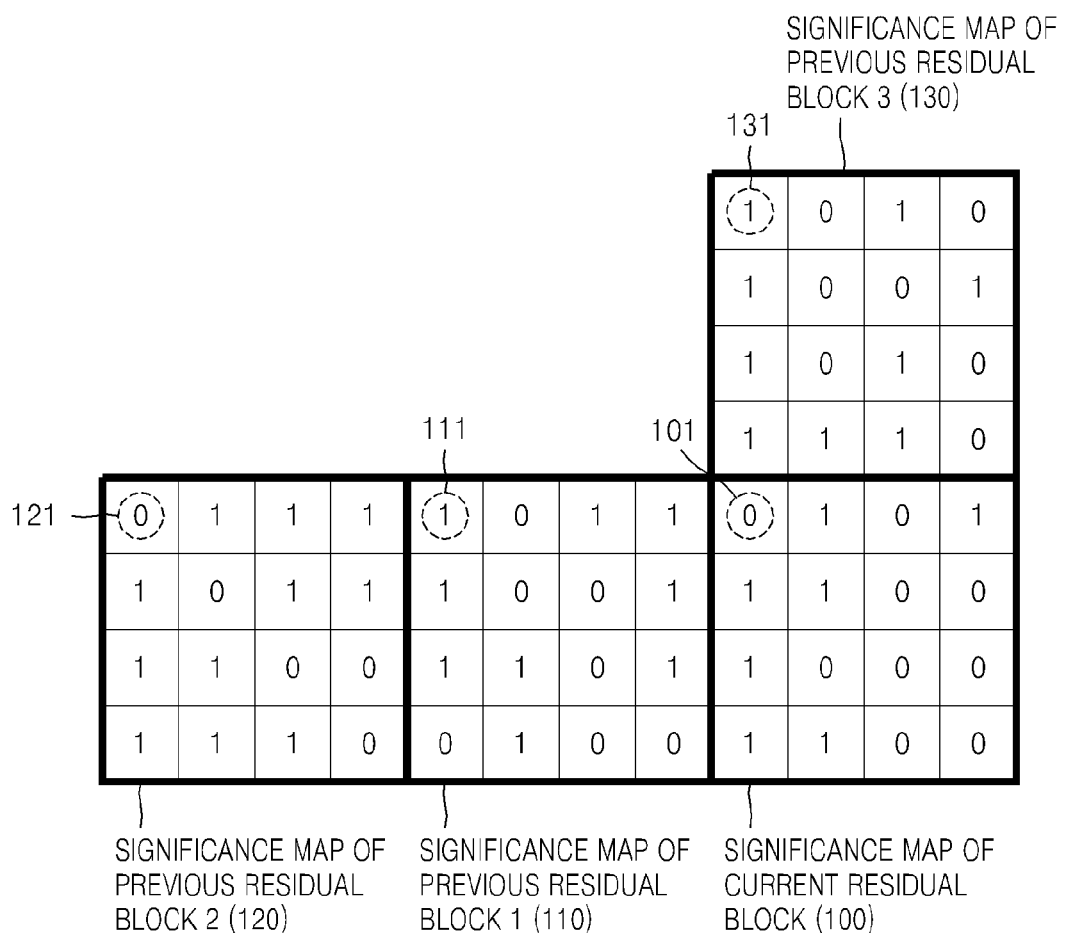
FIG. 11 is a detailed diagram illustrating a process of determining a context which is used when a significance map of a current residual block is encoded according to an embodiment of the present invention.

FIG. 11 is a detailed diagram illustrating a process of determining a context which is used when a significance map of a current residual block is encoded according to an embodiment of the present invention.

As described above, in order to determine the significance maps of the previous residual blocks that are considered when a context for encoding the significance map of the current residual block, the significance map of one residual block that is encoded before the current residual block, or the significance maps of at least two residual blocks that are encoded previously, or the significance maps of two adjacent residual blocks positioned above and to the left of the current residual block, respectively, may be used.

For example, when the binary value 0 of the first scan index 101 of the significance map 100 of a current residual block is encoded, a different context may be determined according to whether or not the coefficient at the corresponding first scan index 111 of the significance map 110 of a previous residual block 1 that is processed before the current residual block is a significant coefficient. In the case illustrated in FIG. 11, the coefficient of the corresponding first scan index 111 of the previous residual block 1 is a significant coefficient 1, and therefore it is highly probable that the coefficient of the corresponding first scan index 101 of the current residual block is also a significant coefficient. In this case, a context in which an MPS is 1 and 1 has a relatively greater probability is selected, and the binary value 0 of the first scan index of the significance map 100 of the current residual block corresponds to an LPS.

An example of a program code implementing a process of selecting a context for encoding the significance map of the current residual block according to whether or not a corresponding coefficient of one previous residual block is as follows:

```
{ For ui<T
    if(prev_block(Coeff[ui])
        ctx_num_sig[coeff[ui]]=CTX1
    Else
        ctx_num_sig[coeff[ui]]=CTX2
For ui≧T
    ctx_num_sig[coeff[ui]]=CTX3 }
```

Here, prev_block(Coeff[ui]) is a binary value indicating whether or not a coefficient at a predetermined scan index (ui) of the previous residual block is a significant value, and is 1 when the coefficient of the previous residual block is a significant coefficient, and is 0 when the coefficient is an insignificant coefficient. In the program code, the process of selecting a context for encoding each binary value forming the significance map is performed in relation to only a predetermined number (T) of binary values. This is because, when scan is performed in a zigzag scan method, spatial correlations between a DC coefficient and neighboring coefficients are large, and correlations between high frequency components are relatively small. According to the program code, when the coefficient of the previous residual block is a significant coefficient, CTX1 is selected as a context (ctx_num_sig[coeff[ui]]) selected for encoding the binary value at a predetermined scan index (ui) of the significance map of the current residual block. When the coefficient of the previous residual block is an insignificant coefficient, CTX2 is selected as a context (ctx_num_sig[coeff[ui]]) selected for encoding the binary value at a predetermined scan index (ui) of the significance map of the current residual block. According to the program code, when a binary value indicating whether or not the remaining coefficients, excluding the predetermined number (T) of coefficients neighboring the DC coefficient, are significant coefficients is encoded, CTX3 is selected.

In another embodiment, when a context for encoding the current significance map is encoded, the context may be determined by using the significance maps of at least two residual blocks, or the significance maps of two adjacent residual blocks positioned above and to the left of the current residual block, respectively. That is, in relation to each of a case when two coefficients of the previous two residual blocks or the two adjacent residual blocks positioned above and to the left of the current residual block, respectively, are all significant coefficients, a case when the coefficients area all insignificant coefficients, and a case when only one coefficient is a significant coefficient, a different context may be determined when each binary value of the significant map of the current residual block is encoded.

Referring again to FIG. 11, a case where a context for encoding the significance map of a current residual block is determined according to whether or not corresponding coefficients of two previous residual blocks are significant coefficients will now be explained. Assuming that the binary value of the significance map 110 of a previous residual block 1 corresponding to an i-th scan index of the significance map 100 of a current residual block is x (x=0,1), and the corresponding binary value of the significance map 120 of a previous residual block 2 is y (y=0,1), one from among (CTX i,0->0), (CTX i, 0->1), (CTX i, 1->0), and (CTX i, 1->1) is selected as a context (CTX i, x->y) to be used for encoding the binary value of the i-th scan index of the current significance map, according to x and y value at the corresponding scan index of the significance maps 110 and 120 of the previous residual blocks 1 and 2.

For example, when the binary value 0 of the first scan index 101 of the significance map 100 of the current residual block is encoded, if the coefficients of the corresponding first scan indexes 111 and 121 of the significance map 110 of the previous residual block 1 and the significance map 120 of the previous residual block 2 that are processed before the current residual block are all 0, (CTX 1,0->0) is selected. If the coefficient of the first scan index 111 of the significance map of the previous residual block 1 is a significant coefficient and the coefficient of the first scan index 121 of the significance map 120 of the previous residual block 2 is 0, (CTX 1,1->0) is selected. If the coefficients of the corresponding first scan indexes 111 and 121 of the significance map 110 of the previous residual block 1 and the significance map 120 of the previous residual block 2 are all significant coefficients, (CTX 1,1->1) is selected.

Similarly, when the significance maps of two adjacent residual blocks positioned above and to the left of a current residual block, respectively, are used, and if it is assumed that the binary value of the significance map 110 of a previous residual block 1 corresponding to an i-th scan index of the significance map 100 of a current residual block is x (x=0,1), and the corresponding binary value of the significance map 130 of a previous residual block 3 is y (y=0,1), one from among (CTX i,0->0), (CTX i, 0->1), (CTX i, 1->0), and (CTX i, 1->1) is selected as a context (CTX i, x->y) to be used for encoding the binary value of the i-th scan index of the current significance map, according to x and y value at the corresponding scan index of the significance maps 110 and 130 of the previous residual blocks 1 and 3.

Figure 12:
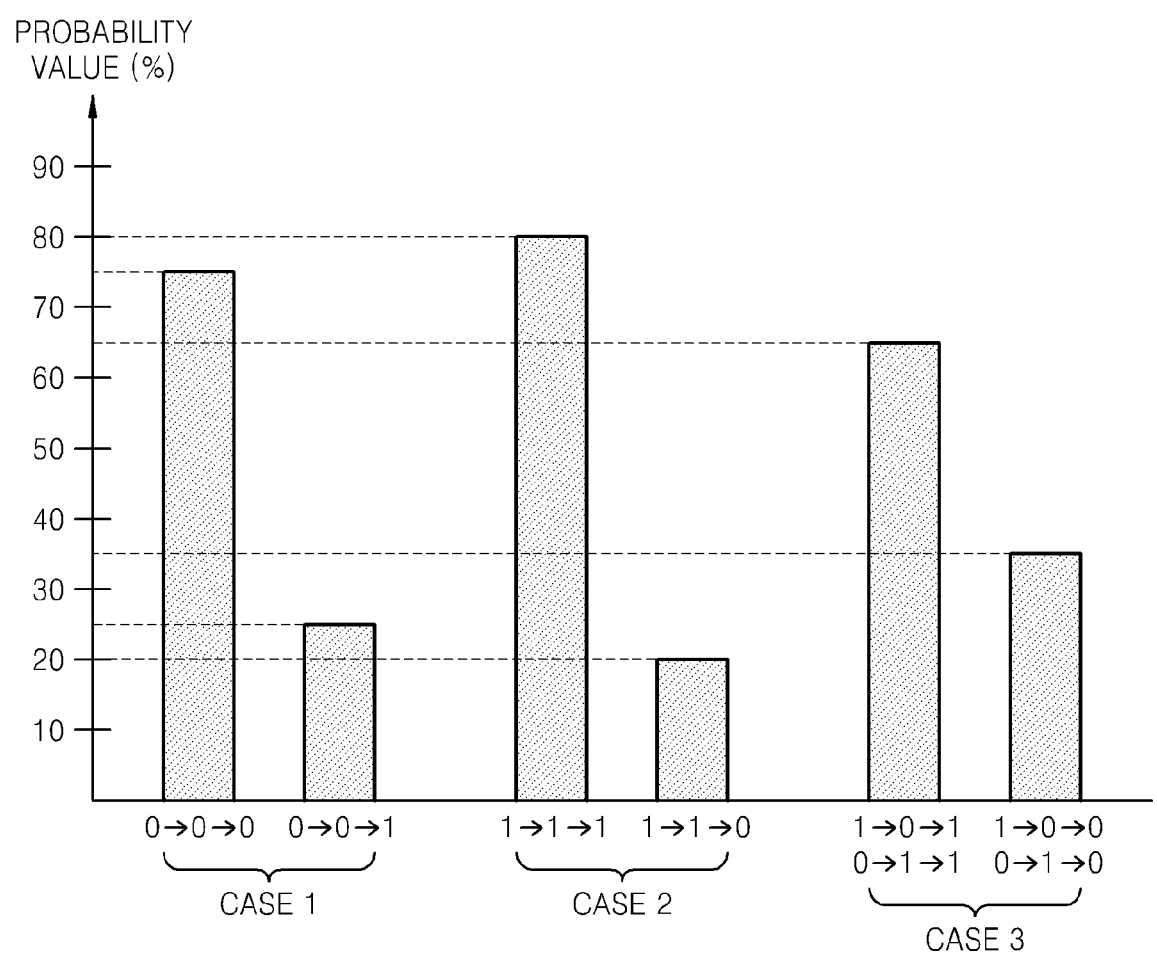
FIG. 12 is a graph illustrating an example of a probability model of a context which is selected by using information on two previous residual blocks according to an embodiment of the present invention.

FIG. 12 is a graph illustrating an example of a probability model of a context which is selected by using information on two previous residual blocks according to an embodiment of the present invention. In the graph illustrated in FIG. 12, a->b->c (a,b=0,1) of the X-axis indicates that binary values of the significance maps of two previous residual blocks corresponding to the binary value (c) of a predetermined index of the significance map of a current residual block changes from a to b. For example, as illustrated in FIG. 11 described above, if the binary value of the first index 101 of the significance map 100 of the current residual is 0, and binary values of the corresponding first indexes 111 and 121 of the significance maps 110 and 120 of the previous residual blocks 1 and 2 are 1 and 0, respectively, it is expressed as 0->1->1 Also, the Y-ax is in FIG. 12 indicates the probability value of the binary value (c) of the significance map of the current residual block provided by a context selected according to the values of the corresponding coefficients of the previous residual blocks.

Referring to FIG. 12, in order to encode the significance map of the current residual block, a case where the corresponding coefficients of the two previous residual blocks are all insignificant coefficients (CASE 1: 0->0->0, 0->0->1), a case where the corresponding coefficients of the two previous residual blocks are all significant coefficients (CASE 2: 1->1-> 0, 1->1->0), and a case where one of the corresponding coefficients of the two previous residual blocks is a significant coefficient and the other is an insignificant coefficient (CASE 3: 0->1->0, 0->1->1, 1->0->0, 1->0->1) are divided, and a different context, i.e., a different probability model, is applied.

More specifically, when the corresponding coefficients of the previous residual blocks are all insignificant coefficients (CASE 1), spatial correlations are considered, thereby selecting a context model in which the probability that the coefficient of the current residual block is also an insignificant coefficient is greater.

As illustrated in FIG. 12, according to the present invention, when the coefficients of the previous residual blocks are all 0, a context in which the probability of 0 that is an MPS is about 0.75 (75%) and the probability of 1 that is an LPS is about 0.25 (25%) is selected.

Similarly, according to the present invention, when the corresponding coefficients of the previous residual blocks are all significant coefficients (CASE 2), a context model in which the probability that the coefficient of the current residual block is also a significant coefficient is greater is selected. As illustrated in FIG. 12, according to the present invention, when the coefficients of the previous residual blocks are all 1, a context in which the probability of 1 that is an MPS is about 0.80 (80%) and the probability of 0 that is an LPS is about 0.20 (20%) is selected. Meanwhile, when only one of the corresponding coefficients of the previous residual blocks is a significant coefficient (CASE 3), the scan index is considered, thereby making the probability of 1 greater in relation to the coefficients of relatively low frequency components adjacent to a DC coefficient, and by considering that only one of the corresponding coefficients of the previous residual blocks is a significant coefficient, a context with a relatively low probability value is selected.

Figure 13:
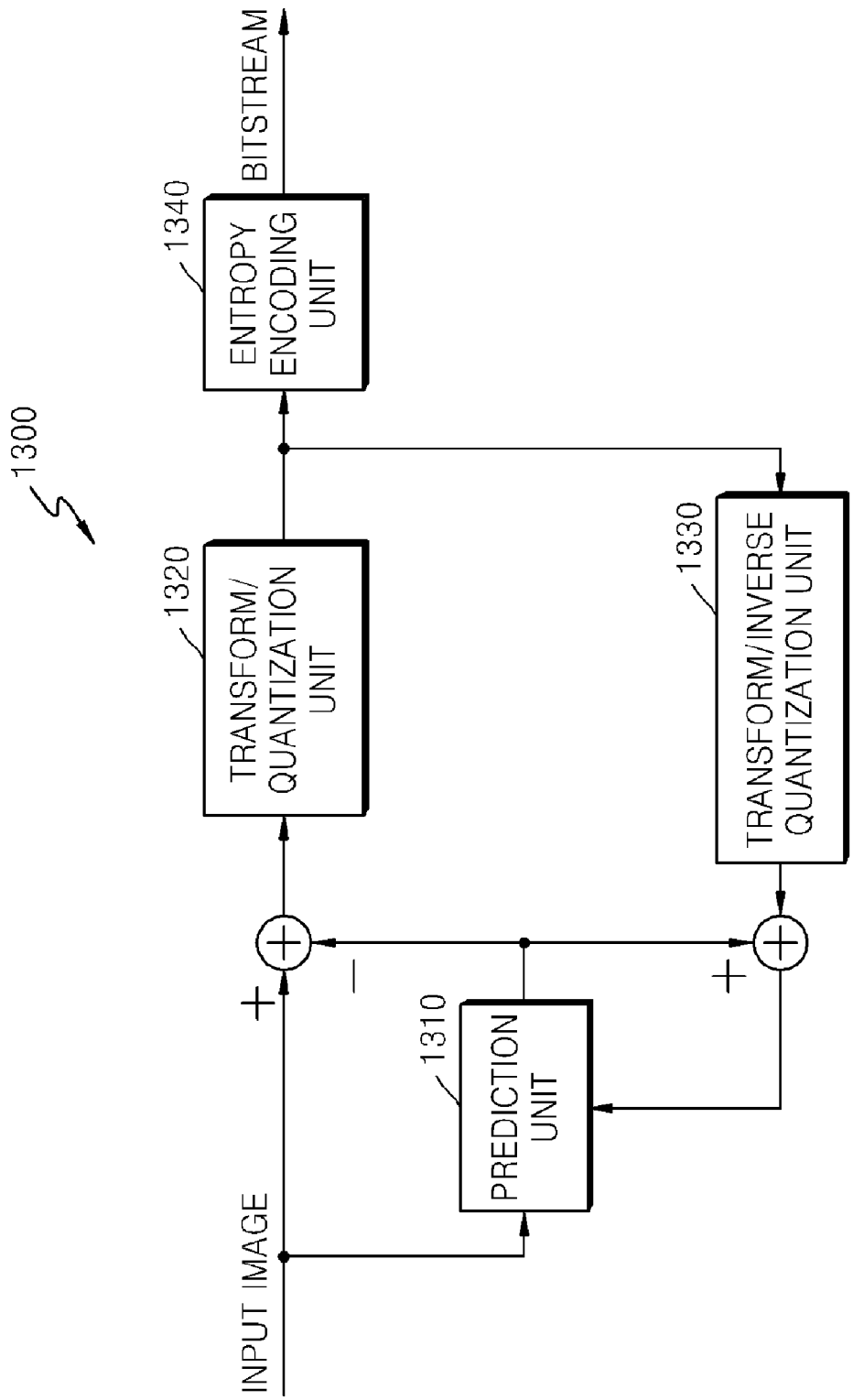
FIG. 13 is a block diagram illustrating a structure of an apparatus for encoding an image to which a context-based binary arithmetic coding apparatus according to an embodiment of the present invention is applied.

FIG. 13 is a block diagram illustrating a structure of an apparatus for encoding an image to which a context-based binary arithmetic coding apparatus according to an embodiment of the present invention is applied. The context-based binary arithmetic coding apparatus according to the present invention is applied to an entropy encoding unit 1340 of FIG. 13.

Referring to FIG. 13, the image encoding apparatus 1300 includes a prediction unit 1310, a transform/quantization unit 1320, an inverse transform/inverse quantization unit 1330, and the entropy encoding unit 1340.

The prediction unit performs inter prediction and intra prediction of an input image and generates a prediction image.

A residual image which is the difference between the prediction image generated in the prediction unit 1310 and the input image is transformed into the frequency domain in the transform/quantization unit 1320 and then, quantized. The transformed and quantized image is inverse-transformed and inverse-quantized in the inverse transform/inverse quantization unit 1330, and is added to the prediction image, thereby restoring an image. Then, the result is used when a next input image is predicted.

The entropy encoding unit 1340 performs context-based binary arithmetic coding in units of residual blocks of a predetermined size, thereby generating a bitstream.

Figure 14:
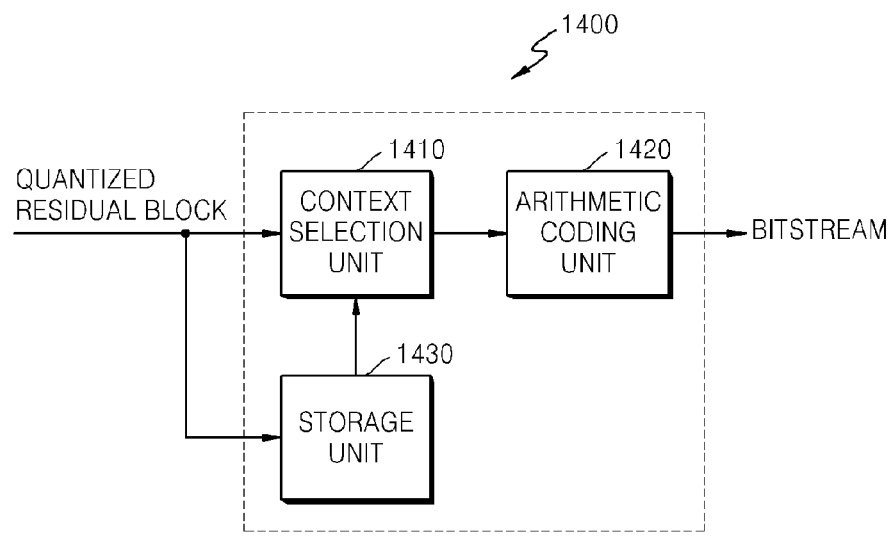
FIG. 14 is a block diagram illustrating a structure of a context-based binary arithmetic coding apparatus according to an embodiment of the present invention.

FIG. 14 is a block diagram illustrating a structure of a context-based binary arithmetic coding apparatus according to an embodiment of the present invention.

Referring to FIG. 14, the context-based binary arithmetic coding apparatus 1400 according to the current embodiment includes a context selection unit 1410, an arithmetic coding unit 1420 and a storage unit 1430.

The storage unit 1430 stores information on syntax elements of residual blocks processed before a current residual block and significance maps of the previous residual blocks.

The context selection unit 1410 selects a context to be used for encoding the significance map of the current residual block according to whether or not a corresponding coefficient of a previous residual block is a significant coefficient, by using the information on the significance maps of the previous residual blocks stored in the storage unit 1430.

The arithmetic coding unit 1420 performs binary arithmetic coding of each binary value forming the significance map of the current residual block, by using the selected context. More specifically, an interval from a real number 0.0 to a real number 1.0 is gradually narrowed, by using the probability of each binary value forming the significance map of the current residual block provided by the context selected by the context selection unit 1410.

Figure 15:
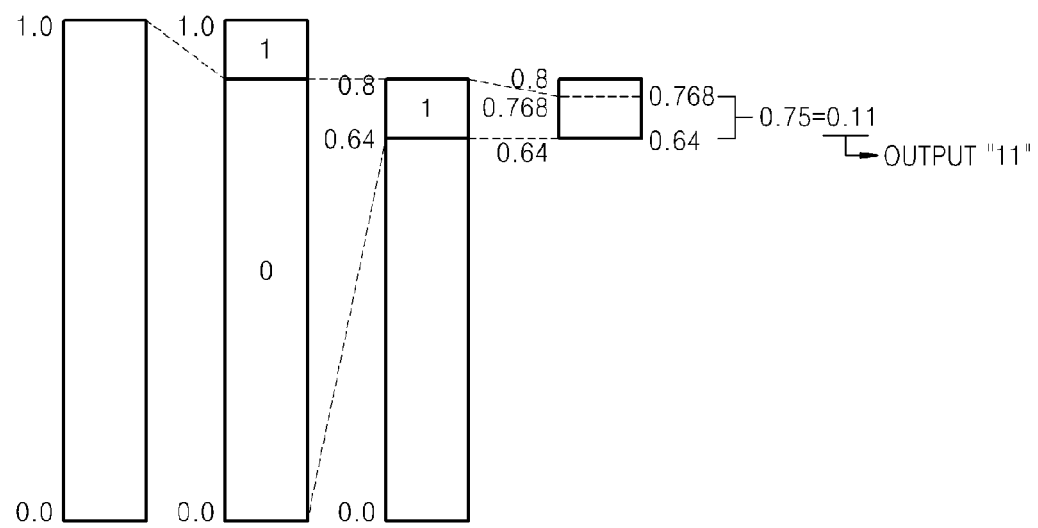
FIG. 15 is a diagram illustrating an example of a process of binary arithmetic coding performed according to an embodiment of the present invention.

FIG. 15 is a diagram illustrating an example of a process of binary arithmetic coding performed in the arithmetic coding unit 1420 illustrated in FIG. 14 according to an embodiment of the present invention. In FIG. 15, it is assumed that binary values forming the significance map of a current residual block are □010□ the probability of 1 is 0.2, and the probability of 0 is 0.8. Here, the probabilities of 1 and 0 are probabilities provided by a context selected according to whether a binary value of the significance map of a previous residual block corresponding to a binary value of the significance map of the current residual block is 0 or 1, as described above. The probabilities of 0 and 1 vary with respect to each scan index of a significance map. However, for convenience of explanation it is assumed here that the probabilities of 1 and 0 are identical in relation to each binary value of a significance map.

Referring to FIG. 15, in a case where the first bin value 0 in the binary values □010□ of the significance map is encoded, [0.0~0.8] that is the bottom 80% part in the initial interval [0.0~1.0] is updated with a new interval. Also, when the next bin value 1 is encoded, [0.64~0.8] that is the top 20% of [0.0~0.8] is updated with a new interval. Also, when the next 0 is encoded, [0.64~0.768] that is the bottom 80% of [0.64~0.8] is updated with a new interval. From a binary number 0.11 corresponding to 0.75 that is a real number included in the final interval [0.64~0.768], the first number 0 is removed and the decimal part □1□is is output as a bitstream corresponding to the binary value □10□of the significance map.

FIG. 16 is a flowchart illustrating a method of context-based binary arithmetic decoding according to an embodiment of the present invention.

Referring to FIG. 16, in operation 1610, according to whether or not a corresponding coefficient of at least one previously decoded residual block is a significant coefficient that is not 0, a context for decoding a predetermined flag, i.e., the significance map, indicating the position of significant coefficients of a current block to be decoded is selected. As described above, in order to decode the significance map of the current residual block, the context may be determined by using the significance map of one residual block that is encoded before the current residual block, or the significance maps of at least two residual blocks, or the significance maps of two adjacent residual blocks positioned above and to the left of the current residual block, respectively.

In operation 1620, by using the probability information according to the context selected in operation 1620, the significance map indicating the positions of significant coefficients of the current residual block is decoded, and then, the level information of the significant coefficients in a bitstream, i.e., sign and absolute value (abs) information is decoded, thereby restoring coefficient values at significant coefficient positions.

FIG. 17 is a diagram illustrating a structure of a context-based binary arithmetic decoding apparatus according to an embodiment of the present invention.

Referring to FIG. 17, the context-based binary arithmetic decoding apparatus according to the current embodiment includes a context selection unit 1710, an arithmetic decoding unit 1720, and a storage unit 173 0.

According to whether or not a corresponding coefficient of at least one previously decoded residual block is a significant coefficient that is not 0, the context selection unit 1710 selects a context for decoding predetermined flags, i.e., the significance map, indicating the positions of significant coefficients of a current block to be decoded.

More specifically, if the coefficient of the previous residual block is a significant coefficient, the context selection unit 1710 selects a context in which the probability of a flag indicating that the corresponding coefficient of the current residual block is a significant coefficient is higher, and if the coefficient of the previous residual block is an insignificant coefficient, the context selection unit 1710 selects a context in which the probability of a flag indicting that the corresponding coefficient of the current residual block is an insignificant coefficient is higher.

Here, when the context for decoding the significance map of the current residual block is selected, the context selection unit 1710 may use the significance maps of two previously decoded residual blocks, or the significance maps of two neighboring previous residual blocks positioned above and to the left of the current residual block, respectively.

The arithmetic decoding unit 1720 performs binary arithmetic decoding of a flag indicating the position of a coefficient of the current residual block, by using the probability information according to the selected context.

The storage unit 1730 stores information on the syntax element of the residual blocks which are processed before the current residual block, and information on the significance map indicating the positions of coefficients.

According to the present invention as described above, when a significance map indicating the positions of coefficients of a residual block is encoded, according to a context subdivided by considering the spatial correlation with corresponding coefficients of the previous residual block, binary arithmetic coding is performed, thereby improving the performance of context-based binary arithmetic coding.

The present invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of context-based adaptive binary arithmetic decoding comprising:

selecting a context for decoding predetermined flags indicating positions of significant coefficients in a current residual block to be decoded, according to whether or not a coefficient of at least one previously decoded residual block, corresponding to a coefficient of the current residual block is a significant coefficient that is not 0; and performing binary arithmetic decoding of the predetermined flags, by using probability information of the selected context.

2. The method of claim 1, wherein in the selecting of the context, if the coefficient of the at least one previous residual block is a significant coefficient, a first context in which a probability of a flag indicating that the coefficient of the current residual block is a significant coefficient is higher is selected, and if the coefficient of the at least one previous residual block is an insignificant coefficient, a second context in which a probability of a flag indicating that the coefficient of the current residual block is an insignificant coefficient is higher is selected.

3. The method of claim 1, wherein in the selecting of the context, the at least one previously decoded residual block comprises two previously decoded residual blocks or a first previous neighboring residual block and a second previous neighboring residual block positioned above and to the left of the current residual block, respectively that are significant coefficients.

4. An apparatus for context-based adaptive binary arithmetic decoding comprising:

a context selection unit which selects a context for decoding predetermined flags indicating positions of significant coefficients in a current residual block to be decoded, according to whether or not a coefficient of at least one previously decoded residual block, corresponding to a coefficient of the current residual block is a significant coefficient that is not 0; and a binary arithmetic decoding unit which performs binary arithmetic decoding of the predetermined flags, by using probability information of the selected context.

5. The apparatus of claim 4, wherein if the coefficient of the at least one previously decoded residual block is a significant coefficient, the context selection unit selects a first context in which a probability of a flag indicating that the coefficient of the current residual block is a significant coefficient is higher, and if the coefficient of the at least one previous residual block is an insignificant coefficient, the context selection unit selects a second context in which a probability of a flag indicating that the coefficient of the current residual block is an insignificant coefficient is higher.

6. The apparatus of claim 4, wherein the at least one previous residual black comprises two previously decoded residual blocks or a first previous neighboring residual block and a second previous neighboring residual block positioned above and to the left of the current residual block, respectively, that are significant coefficients.

7. An context-based adaptive binary arithmetic decoding apparatus comprising:

a context selection unit that receives an encoded flag, the encoded flag indicating whether a value of a first coefficient at a position in a residual block is a non-zero value, determines whether a value of a second coefficient at the position in a previously decoded residual block is a non-zero value, and selects from among a plurality of contexts for decoding the encoded flag a context based on whether the value of second coefficient is a non-zero value;

a binary arithmetic decoding unit that decodes the flag using the selected context.

8. The context-based adaptive binary arithmetic decoding apparatus of claim 7, wherein the binary arithmetic decoding unit decodes the flag using probability information of the selected context.

9. The context-based adaptive binary arithmetic decoding apparatus of claim 7, wherein the context selection unit selects from among the plurality of contexts a first context as the selected context, in response to determining that the value of second coefficient is a non-zero value, and selects from among the plurality of contexts a second context as the selected context, in response to determining that the value of second coefficient is zero.

* * * * *